US006366180B1

(12) United States Patent
Rodriguez-Duran et al.

(10) Patent No.: US 6,366,180 B1
(45) Date of Patent: Apr. 2, 2002

(54) MAINS FILTER

(75) Inventors: José-I. Rodriguez-Duran; Thomas Riesle, both of Villingen-Schwenningen; Hans-Otto Haller, Niedereschach, all of (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/430,867

(22) Filed: Nov. 1, 1999

(Under 37 CFR 1.47)

(30) Foreign Application Priority Data

Nov. 20, 1998 (DE) ........................................ 198 53 510

(51) Int. Cl.[7] ................................................ H03H 7/01
(52) U.S. Cl. ........................ 333/181; 333/185; 307/105
(58) Field of Search ................................ 333/181, 185, 333/177; 307/105

(56) References Cited

U.S. PATENT DOCUMENTS

| | | | | | |
|---|---|---|---|---|---|
| 4,203,081 | A | | 5/1980 | Braeckelmann | 333/138 |
| 5,039,964 | A | * | 8/1991 | Ikeda | 333/181 |
| 5,187,456 | A | * | 2/1993 | Hayashi | 333/181 |
| 5,801,602 | A | * | 9/1998 | Fawal et al. | 333/177 |
| 6,144,269 | A | * | 11/2000 | Okamoto et al. | 333/184 |

FOREIGN PATENT DOCUMENTS

| | | |
|---|---|---|
| AT | 1073046 | 1/1960 |
| DE | 1213072 | 10/1966 |
| DE | 1919132 | 9/1970 |
| DE | 3228449 | 9/1984 |
| DE | 4030193 | 4/1991 |
| EP | 0492653 | 7/1992 |
| GB | 2087656 | 5/1982 |
| GB | 2163603 | 2/1986 |

* cited by examiner

*Primary Examiner*—Robert Pascal
*Assistant Examiner*—Stephen E. Jones
(74) *Attorney, Agent, or Firm*—Joseph S. Tripoli; Joseph J. Laks; Joseph J. Kolodka

(57) ABSTRACT

The mains filter comprises coils with windings which are arranged on substrates, for example conventional thin printed circuit boards, as conductor tracks. A coil can comprise one or more substrates, which are in contact with one another in the case of a plurality of substrates. In the centre, the substrates have an opening through which a core is passed. With an appropriate number of windings, one substrate is sufficient for one winding, so that only one substrate per coil is required for the mains filter. The two substrates for the two coils can be of identical design, in particular, the input and the output for a coil being arranged on a substrate in the region of opposite corners. The core used can be a narrow E/E core or E/I core, so that the space requirement for the filter on a circuit board is very low.

3 Claims, 1 Drawing Sheet

MAINS FILTER

BACKGROUND

The invention is based on a mains filter having two coils arranged on a common core.

Filters of this kind are used, in particular, at the input in switched-mode power supplies for connection to the mains supply. They not only prevent high-frequency interference produced in the switched-mode power supply from reaching the mains supply via the mains connection but also prevent high-frequency interference from reaching the appliance via the mains supply, whilst allowing the 50-Hz mains frequency through essentially unattenuated.

In this arrangement, the coils are usually produced on a cylindrical coil former which is divided into chambers and has windings made from a copper wire, a core being passed through the coil former. The operating principle of such a filter is explained with reference to FIG. 1. In this case, each wire in the mains line is passed through a respective coil C1 or C2, the two windings C1, C2 having opposite polarities, with reference to the two inputs E1 and E2. This means that high-frequency interference propagating on one input line, for example over input line E1, is subjected to the full inductance of the coil C1. On the other hand, however, at the mains supply's 50-Hz frequency, which is applied to the two inputs E1, E2 simultaneously, the different polarities of the two windings cause the magnetic fields in the core to be cancelled out. The filter should therefore be of symmetrical design, so that no input impedance is formed for the 50-Hz frequency. The two coils C1, C2 are coupled to one another magnetically by means of a common core (not shown).

The object of the present invention is to specify a filter of the type mentioned above which has good electrical properties together with compact dimensions.

SUMMARY OF THE INVENTION

The mains filter of the invention comprises coils with windings which are arranged on substrates, for example conventional thin printed circuit boards, as conductor tracks. In this arrangement, a coil can contain one or more substrates, which are in contact with one another in the case of a plurality of substrates. In the centre, the substrates have an opening through which a core is passed.

A substrate comprises, in particular, a plurality of windings which are routed spirally inwards and through a plated-through hole to the other side of the substrate. On the reverse, the winding is routed spirally outwards again, so that the two connections for the winding can be made at the edge of the circuit board. In particular, this means that the input and the output for a coil can also be arranged on opposite sides of the circuit board. With an appropriate number of windings, one substrate is sufficient for one winding, so that only one substrate per coil is required for the filter. The two substrates for the two coils can, in particular, be of identical design, the input and the output for a coil being arranged on a substrate in the region of opposite corners. Symmetrical considerations mean that an E/E core or an E/I core is advantageous.

With plated-through holes, insulation between the two coils is necessary. For this, a dielectric interlayer, for example a plastic film, can be used. However, it is also possible to coat the opposite sides of the substrates accordingly with a dielectric material. The insulation requirements for a mains filter are significantly lower than for a transformer. This means that virtually the full width of the substrates can be used in the region inside the openings in the core.

Both the core and the substrates with the conductor tracks arranged on them can be manufactured with very high precision. In this respect, the substrates can be dimensioned such that they are held without play by the core alone, particularly its openings. A coil former is therefore not required. Known etching methods are used to arrange the conductor tracks, on the substrates, in particular extremely symmetrically, so that a mains filter with substrates has significantly better electrical properties than one with a coil former having a copper wire winding with a great deal of asymmetry.

The core used can be a narrow E/E core or E/I core, in particular, so that the filter is very compact and can be arranged perpendicularly on a circuit board in a power supply unit using appropriate retaining means, the space requirement on the circuit board being very low. In many appliances, the switched-mode power supply is arranged in a screened metal cage as an external unit with a circuit board. Since a switched-mode power supply frequently uses two mains filters, this means that the size of the power supply unit is significantly reduced.

The filter is used, in particular, for current-compensated mains filters in switched-mode power supplies, for example in consumer electronic appliances.

BRIEF DESCRIPTION OF THE DRAWINGS

The invention is explained below by way of example with reference to schematic drawings, in which.

DETAILED DESCRIPTION

Figure 1:
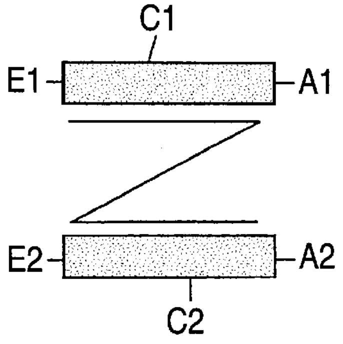
FIG. 1 PRIOR ART
FIG. 1 shows the electrical design of a symmetrical filter (prior art)

FIG. 1 shows a current-compensated mains filter having two coils C1 and C2 and the corresponding inputs E1, E2 and outputs A1, A2, as already explained above. The two coils are arranged symmetrically in this case and are connected to one another magnetically by means of a common core. The winding direction of the windings of the two coils C1 and C2 is such that the two windings are counter-coupled.

Figure 2:
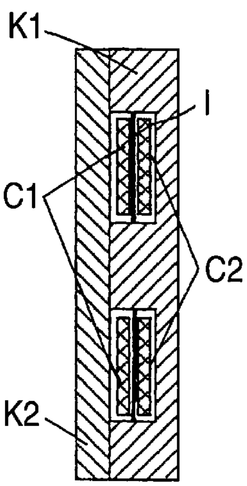
FIG. 2 shows a section through a filter with an E/I core.

FIG. 2 shows a section through the core and the two coils C1 and C2 of the filter according to the invention. In this exemplary embodiment, the core comprises an E/I core having two core halves K1 and K2. In place of an E/I core, an E/E core can also be used and gives the filter comparable electrical properties. The two coils C1 and C2 are merely indicated here as windings. A dielectric and thus nonconductive interlayer I is situated between the two.

Figure 3A:
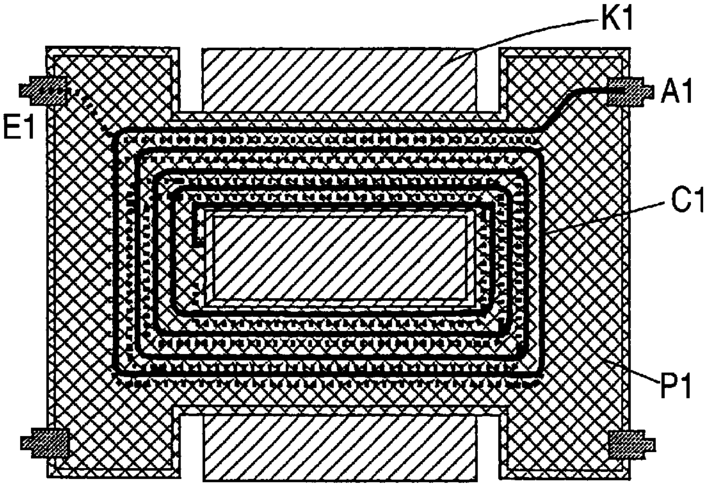
FIG. 3*a* shows a core half with the first coil.

The coil C1 is designed as shown in FIG. 3*a*, which shows a plan view of a substrate P1 and a section through the core half K1. In this arrangement, the coil C1 is applied to both sides of the substrate P1 as a conductor track, for example using a conventional etching method, the conductor track being routed from an input E1 spirally inwards on the top around the central core limb of the core half K1. The centre of the substrate P1 has an opening which matches the central core limb of the core part K1 as exactly as possible. At the end of the spiral, the conductor track is routed to the other side of the substrate P1, for example through a plated-through hole, and again spirally around the opening to an output A1. In this arrangement, the windings on the two sides of the substrate P1 can be arranged symmetrically with great precision, the top and bottom conductor tracks advantageously being congruent. For the coil C1, substrates using multilayer technology are also particularly suitable, and these can be used to produce a large number of windings.

Figure 3B:
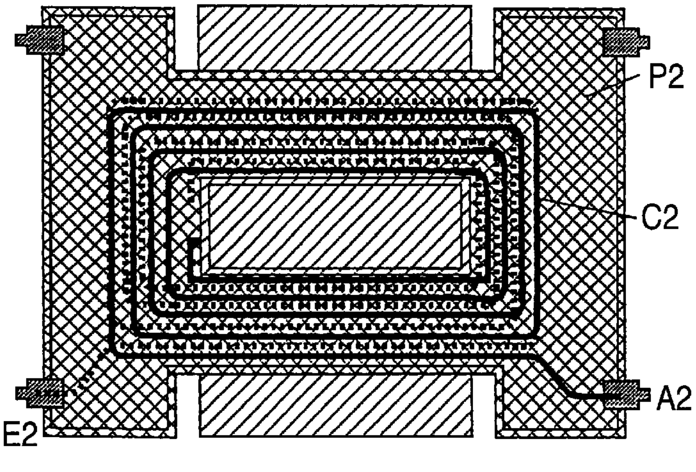
FIG. 3*b* shows a core half with the second coil.

The coil C2, which is of identical design to the coil C1 but is mounted in the core symmetrically with respect to said coil C1, is shown in FIG. 3*b*. It is likewise arranged on one or more substrates P2, but their input E2 and output A2 are arranged in opposite corners in relation to the input and the output for the coil C1. The symmetry of the substrates implies that the substrate P1 for the coil C1 can be converted to the substrate P2 for the coil C2 by turning it round.

The substrates P1, P2 can be manufactured to fit the core limbs of the two core parts K1 and K2 virtually exactly, so that the two coils C1, C2 are very symmetrical with respect to the core, which produces improved electrical properties as compared with previously known filters. At the same time, the coil former becomes superfluous. The flat substrates P1, P2 mean that a very flat E/E ferrite core or E/I ferrite core can be used, as shown in FIG. 2. This ferrite core can be arranged perpendicularly on the circuit board of an appliance using appropriate retaining means, so that the space requirement on the circuit board is very low.

What is claimed is:

1. Mains filter having a first coil, a second coil, and a common core, said coils being arranged as conductor tracks on substrates, said core being a E/I or E/E ferrite core with a central core leg, each coil being arranged as windings with conductor tracks on both sides of said substrates, each winding being routed spirally inwards on one side around an opening and being coupled via a plated-through hole to the other side of the respective substrate, and being routed spirally outwards again, said opening being a central opening through which said central leg of said core is passed, said substrates having H-shaped extensions for arranging the inputs and the outputs for said windings of each coil on opposite sides in the corners of said extensions of the mains filter, a dielectric interlayer being arranged between said two coils, and said substrates for said two coils being printed circuit boards of same shape and being arranged symmetrically with respect to one another and to said opening, and without play on said core.

2. Main filter according to claim 1 wherein the mains filter is a current-compensated mains filter for a switched-mode power supply.

3. Mains filter according to claim 1 wherein the mains filter has a rectangular contour with a narrow side and a broad side, and in that it has retaining means for fixing it by its narrow side on a circuit board.

* * * * *